United States Patent [19]
Fukunaga

[11] Patent Number: 6,014,388
[45] Date of Patent: *Jan. 11, 2000

[54] SHORT WAVELENGTH LASER

[75] Inventor: Toshiaki Fukunaga, Kanagawa-ken, Japan

[73] Assignee: Fuji Photo Film Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/841,592

[22] Filed: Apr. 30, 1997

[30] Foreign Application Priority Data

Apr. 30, 1996 [JP] Japan ................................ 8-109399

[51] Int. Cl.[7] ....................................................... H01S 3/30
[52] U.S. Cl. .................................. 372/5; 372/22; 372/64; 372/92
[58] Field of Search ................................ 372/97, 64, 22, 372/92, 5; 359/333

[56] References Cited

U.S. PATENT DOCUMENTS

| | | | |
|---|---|---|---|
| 4,951,293 | 8/1990 | Yamamoto et al. | 372/50 |
| 5,185,752 | 2/1993 | Welch et al. | 372/22 |
| 5,206,868 | 4/1993 | Deacon | 372/21 |
| 5,321,718 | 6/1994 | Waarts et al. | 372/22 |
| 5,418,802 | 5/1995 | Chwalck | 372/64 |
| 5,452,312 | 9/1995 | Yamamoto et al. | 372/5 |
| 5,530,582 | 6/1996 | Clark | 359/333 |
| 5,610,934 | 3/1997 | Zarrabi | 372/92 |
| 5,799,024 | 8/1998 | Bowers et al. | 372/11 |
| 5,802,084 | 9/1998 | Bowers et al. | 372/18 |

OTHER PUBLICATIONS

"Blue Light Intensity Modulation in a Frequency Doubled Tapered Amplifier Modelocked Laser", Goldberg et al., Electronics Letters, vol. 30, No. 16, Aug. 4, 1994, pp. 1296–1297.

"Efficient Second–Harmonic Conversion of CW Single––Frequency Nd:YAG Laser Light By Frequency Locking to a Monolithic Ring Frequency Doubler", Gerstenberger et al., Optics Letters, vol. 16, No. 13, Jul. 1, 1991, pp. 992–994.

*Primary Examiner*—Leon Scott, Jr.
*Attorney, Agent, or Firm*—Sughrue, Mion, Zinn Macpeak & Seas, PLLC

[57] ABSTRACT

A short wavelength laser includes a light source having a fundamental generating portion which emits fundamental wave and a wavelength convertor which converts the fundamental wave to its second harmonic. A light amplifier amplifies the second harmonic.

6 Claims, 4 Drawing Sheets

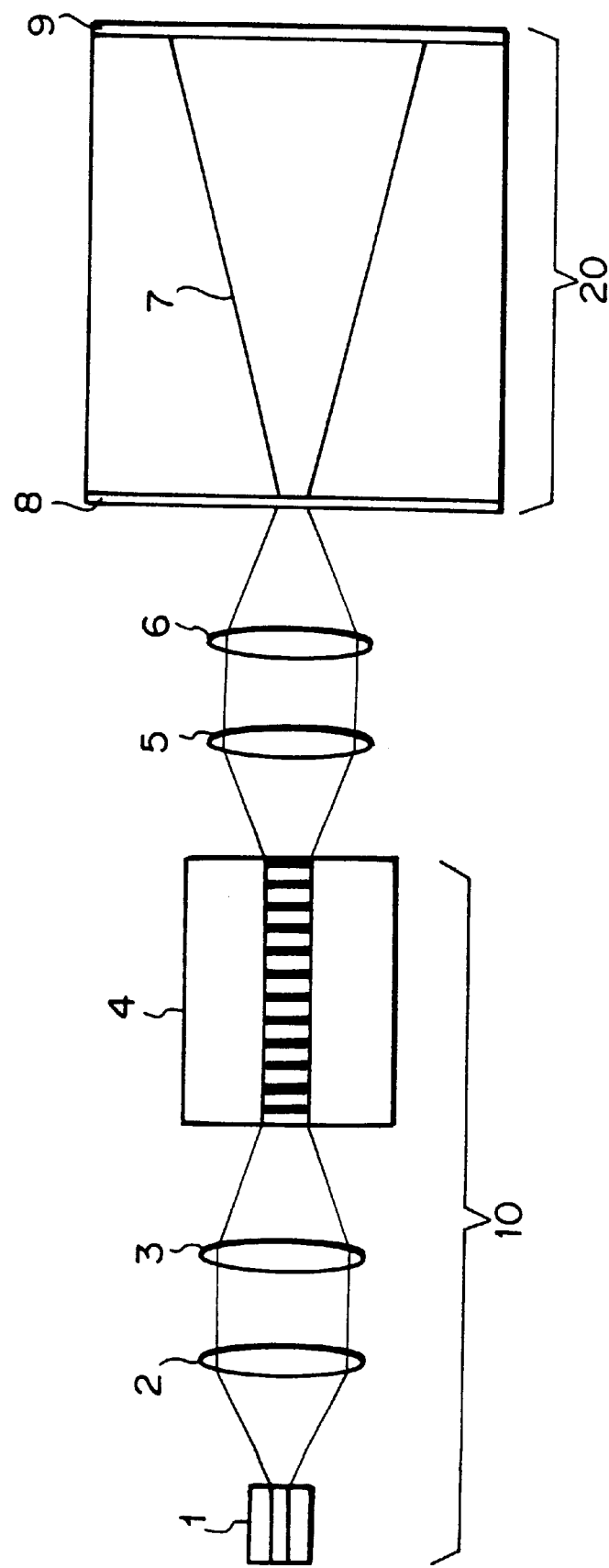

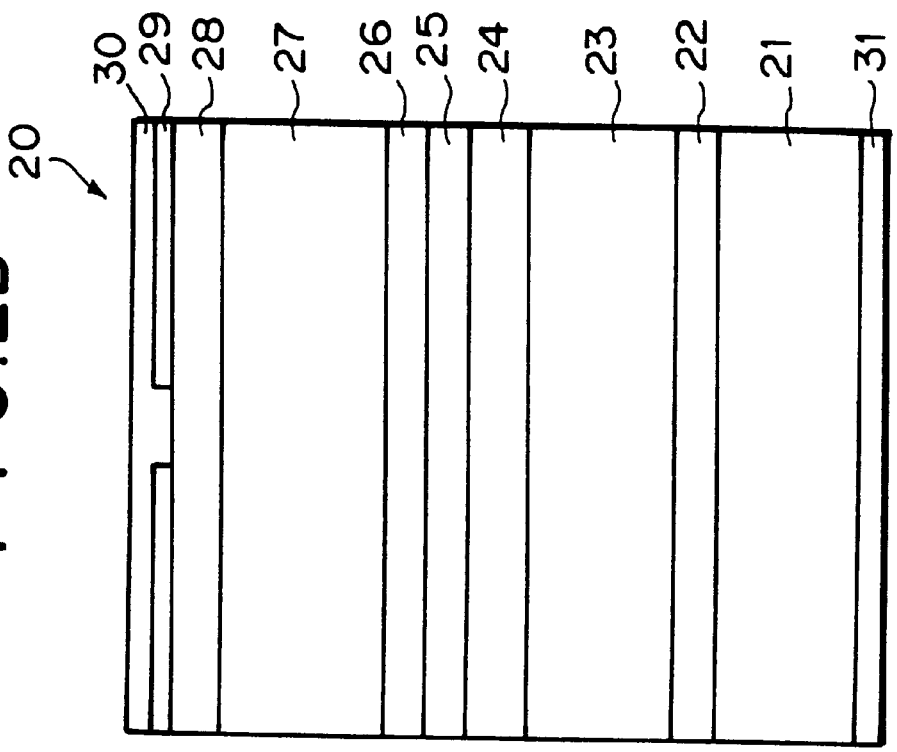
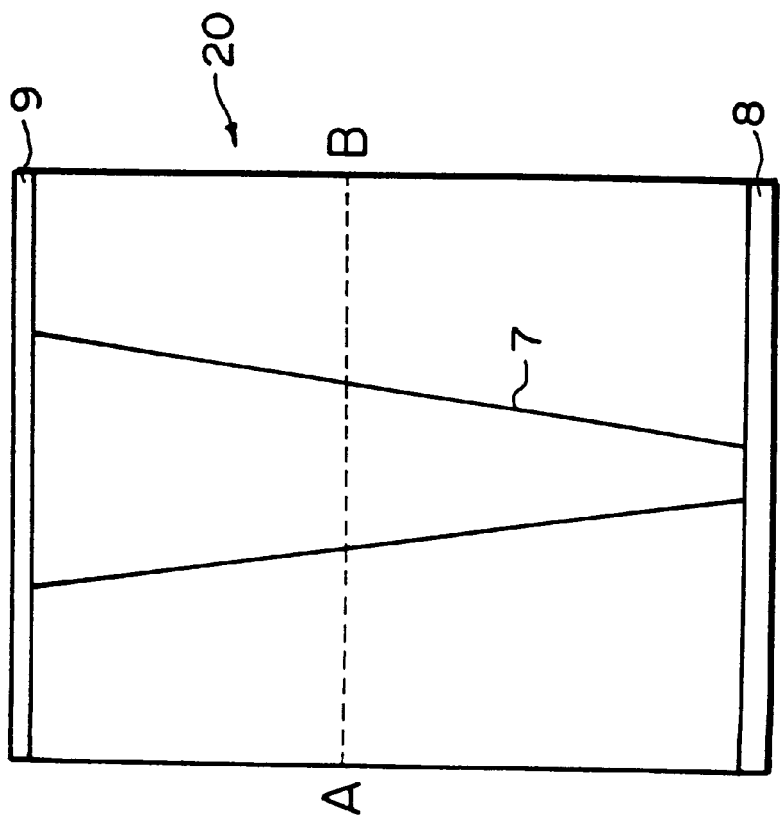

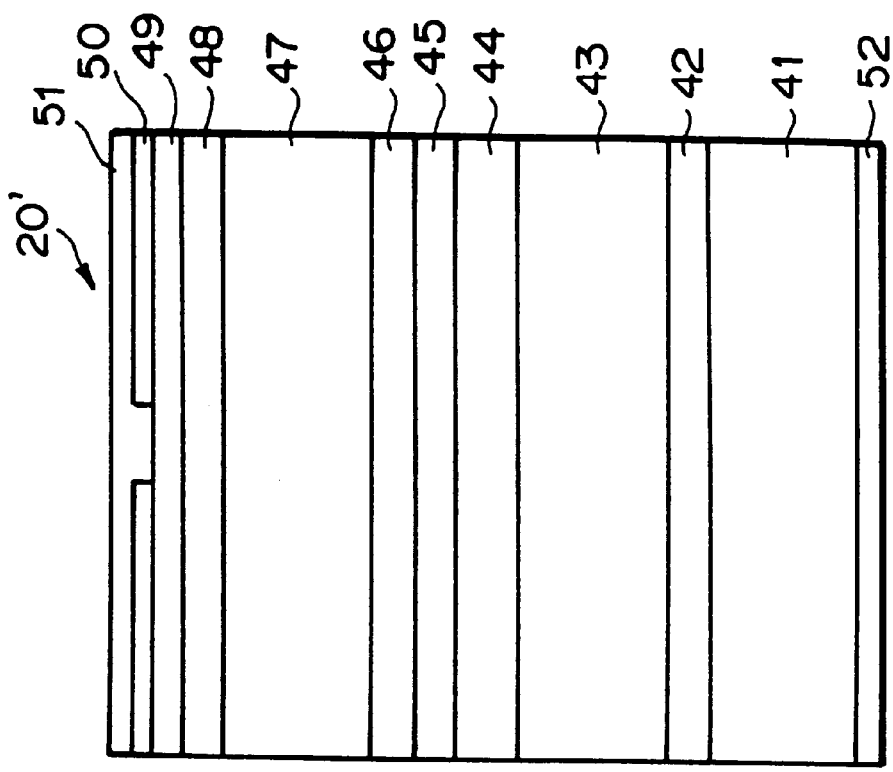
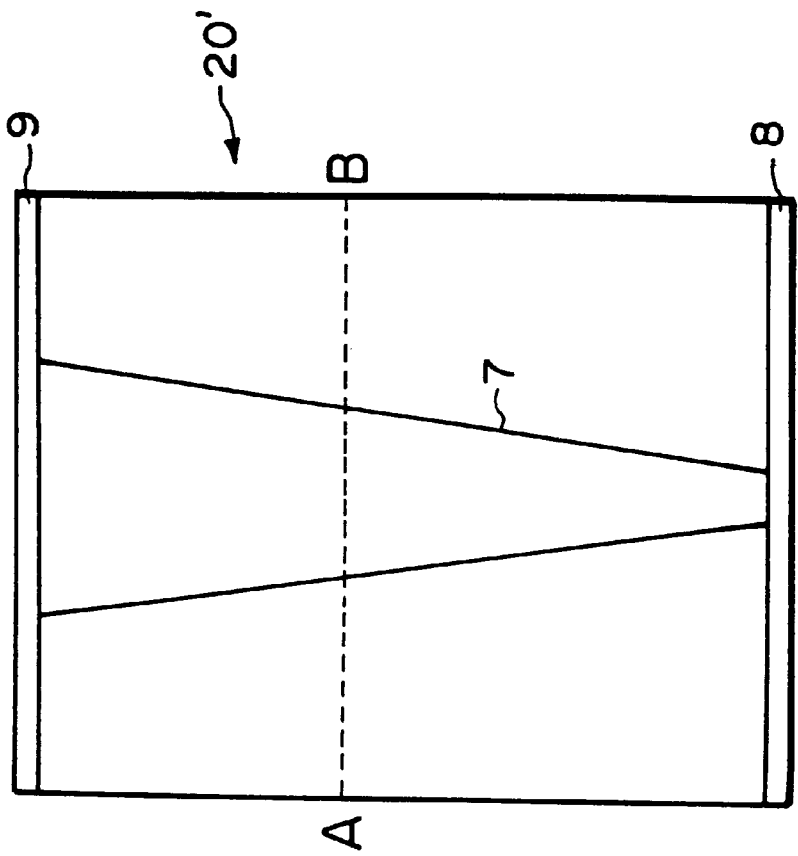

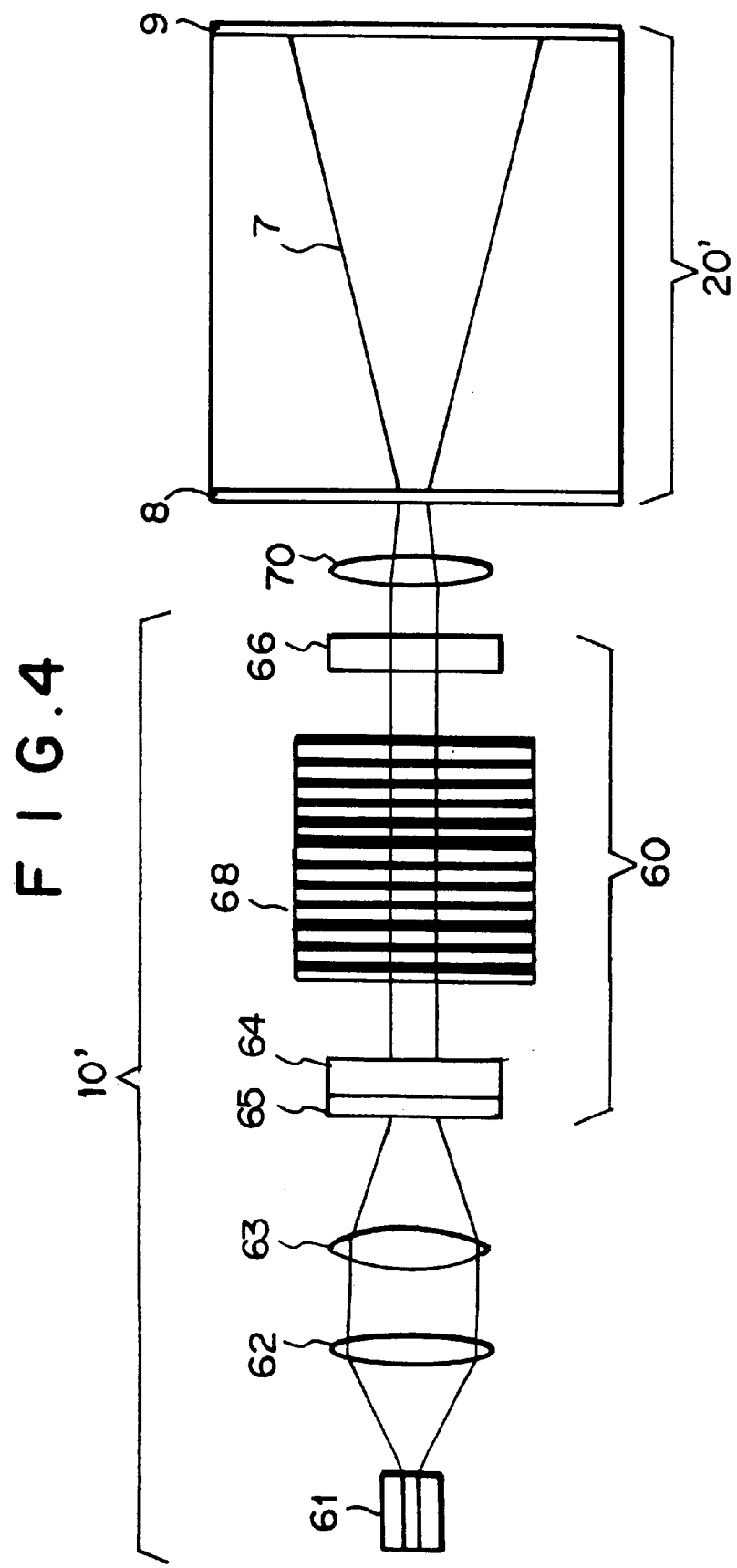

SHORT WAVELENGTH LASER

BACKGROUND OF THE INVENTION

1. Field of the Invention

This invention relates a short wavelength laser.

2. Description of the Related Art

Many attempts to generate a blue laser beam have been made. For example, in a laser disclosed in U.S. Pat. No. 4,951,293, a laser beam in a 0.84 µm band as the fundamental emitted from a semiconductor laser which oscillates in a single mode is converted to the second harmonic by use of a $LiNbTaO_3$ wavelength convertor, thereby realizing a blue laser beam.

In the laser, the second harmonic output is about 2mW at the most with the semiconductor laser driven by 100mW. Further even if the semiconductor laser whose output can be as high as 200 mW is used, the second harmonic output is about 10 mW at the most.

In the blue laser described in "Electronics Letters" Vol. 30, No. 16 (1994) pp. 1296, the output of a semiconductor laser which oscillates in a single mode is amplified by a tapered amplifier and the amplified laser beam is converted to the second harmonic a wavelength convertor ($KNbO_3$), thereby generating a blue laser beam.

Also in this arrangement, since the output of the semiconductor laser is limited, the output of the blue laser beam is about 40 mW at the most.

The laser having an internal resonator structure and an external intensity modulation mechanism described in "Optics Letters", Vol. 16 (1991) pp. 992 can generate a green laser beam at 200 mW at the most.

However the laser is disadvantageous in that since the reliability of the laser at the maximum output power depends upon the semiconductor laser for pumping the solid state laser and a light output power on the order of several $MW/cm^2$ is required to realize a high quality mode, long reliability cannot be ensured due to deterioration by chemical reaction on the end faces.

SUMMARY OF THE INVENTION

In view of the foregoing observations and description, the primary object of the present invention is to provide a high output power short wavelength laser which is stable in beam quality during oscillation at high output power and can hold reliability for a long term.

The short wavelength laser of the present invention comprises a light source having a fundamental generating portion which emits fundamental wave and a wavelength convertor which converts the fundamental wave to its second harmonic and a light amplifier which amplifies the second harmonic.

It is preferred that the light amplifier be provided with antireflection coating on both the light incident end face through which the second harmonic enters the amplifier and the light emanating end face from which the amplified second harmonic emanates and be provided with an optical wave guide extending from the light incident end face to the light emanating end face.

The optical wave guide may be substantially uniform in width from the light incident end face to the light emanating end face, may be tapered from the light emanating end face toward the light incident end face, or may be tapered toward the light incident end face only near the light emanating end face.

The light amplifier may have light modulation function.

In the short wavelength laser of the present invention, a high quality Gaussian blue laser beam can be generated with small power consumption by amplifying the second harmonic obtained by wavelength-conversion of the fundamental wave. When the light amplifier is provided with antireflection coating on both the light incident end face and the light emanating end face thereof, the second harmonic amplifying efficiency can be improved.

Further when the light amplifier is provided with an optical wave guide, the density of light in the stripe can be reduced and generation of kink in the current-light output characteristics can be suppressed by spatial hole burning of injected carriers. Further when the optical wave guide is tapered from the light emanating end face toward the light incident end face, or tapered toward the light incident end face at least near the light emanating end face, the density of light at the light emanating end face can be reduced and deterioration of the light emanating end face due to optical damage can be suppressed, whereby a highly reliable high power short wavelength laser which operates in controlled transverse mode can be obtained.

BRIEF DESCRIPTION OF THE DRAWINGS

FIG. 1 is a schematic view showing a short wavelength laser in accordance with a first embodiment of the present invention, FIG. 2A is a side view of an example of the light amplifier for blue to purple blue (390 to 480 nm) which can be employed in the laser, FIG. 2B is a cross-sectional view of the light amplifier taken along line A–B in FIG. 2A, FIG. 3A is a side view of another example of the light amplifier for blue to purple blue (390 to 480 nm) which can be employed in the laser, FIG. 3B is a cross-sectional view of the light amplifier taken along line A–B in FIG. 3A, and FIG. 4 is a schematic view showing a short wavelength laser in accordance with a second embodiment of the present invention.

DESCRIPTION OF THE PREFERRED EMBODIMENTS

In FIG. 1, a short wavelength laser in accordance with a first embodiment of the present invention comprises a master light source 10, a collimator lens 5 which collimates light emitted from the master light source 10, a condenser lens 6 which condenses the collimated light and a light amplifier 20 which amplifies the condensed light.

The master light source 10 comprises a semiconductor laser 1 which oscillates in a single mode at a wavelength of 780 to 1100 nm, a collimator lens 2 which collimates a laser beam emitted from the laser 1, a condenser lens 3 which condenses the collimated laser beam, and a $LiNbTaO_3$ wavelength convertor 4 which converts the condensed laser beam (as the fundamental wave) to its second harmonic. The wavelength convertor 4 is an optical waveguide type pseudo-phase-matching wavelength convertor having periodic domain reversals.

The laser beam emitted from the semiconductor laser 1 impinges upon the wavelength convertor 4 after collimated and condensed by the lenses 2 and 3 and is converted to its second harmonic. The single mode second harmonic emitted from the wavelength convertor 4 is collimated and condensed on the light incident end face of an optical waveguide 7 of the light amplifier 20. The optical waveguide 7 flares toward its light emanating end face from the light incident end face. When an electric current is injected into the optical waveguide 7, the second harmonic is amplified while it is travelling through the optical waveguide and an amplified Gaussian laser beam emanates from the light emanating end face of the optical waveguide 7. The end faces of the light amplifier 20 are provided with antireflection coating layers 8 and 9 and accordingly the single mode and the transverse mode control are maintained. By controlling the electric current injected into the optical waveguide, intensity of the laser beam emitted from the light amplifier 20 can be modulated.

The temperatures of the semiconductor laser 1, the wavelength convertor 4 and the light amplifier 20 are separately controlled. With the arrangement described above, a high power and high quality Gaussian laser beam can be generated while maintaining the single transverse mode.

FIGS. 2A and 2B show an example of the light amplifier 20 which can be employed in the short wavelength laser of the present invention. The light amplifier of this example comprises an n-GaN buffer layer 22, an n-$Al_{x3}Ga_{1-x3}N$ cladding layer 23, n-GaN optical waveguide layer 24, an $In_{x1}Ga_{1-x1}N/In_{x2}Ga_{1-x2}N$ multiple strain quantum well active layer 25 (x1>x2), a p-GaN optical waveguide layer 26, a p-$Al_{x3}Ga_{1-x3}N$ cladding layer 27 and a p-GaN contact layer 28 formed on an n-SiC substrate 21 in this order by metal organic chemical vapor deposition. A SiN insulating film 29 is superposed on the contact layer 28. The insulating film 29 is removed to form a stripe region which flares at about 6° toward the light emanating end face from the light incident end face where the stripe region is 4 μm wide and a p-side electrode 30 is formed on the insulating film 29. The stripe region functions as a current injecting window and determines the optical waveguide 7. An n-side electrode 31 is formed on the lower side of the substrate 21 and resonator end faces are formed by cleavage or dry etching. The resonator end faces are provided with the antireflection coating layers 8 and 9, thereby suppressing laser oscillation.

FIGS. 3A and 3B show another example of the light amplifier 20 which can be employed in the short wavelength laser of the present invention. The light amplifier of this example comprises an n-ZnMgSSe cladding layer 42, an n-ZnSSe optical waveguide layer 43, a ZnCdSe multiple strain quantum well active layer 44, a p-ZnSSe optical waveguide layer 45, a p-ZnMgSSe cladding layer 46, a p-ZnSSe layer 47, a p-ZnSe/ZnTe superlattice layer 48 and a p-ZnMgSSe contact layer 49 formed on an n-GaAs substrate 41 in this order by molecular beam epitaxial growth method. A $SiO_2$ insulating film 50 is superposed on the contact layer 49. Each of the cladding layers 42 and 46 and the optical waveguide layers 43 and 45 is of a composition which matches with the GaAs substrate 41 in lattice. The oscillation wavelength can be changed by changing the Cd content of the ZnCdSe multiple strain quantum well active layer 44. The insulating film 50 is removed to form a stripe region which flares at about 6° toward the light emanating end face from the light incident end face where the stripe region is 4 μm wide and a p-side electrode 51 is formed on the insulating film 50. An n-side electrode 52 is formed on the lower side of the substrate 41 and resonator end faces are formed by cleavage. The resonator end faces are provided with the antireflection coating layers 8 and 9, thereby suppressing laser oscillation.

In FIG. 4, a short wavelength laser in accordance with a second embodiment of the present invention comprises a master light source 10', a condenser lens 70 which condenses light emitted from the master light source 10' and a light amplifier 20' which amplifies the condensed light.

The master light source 10' comprises a high power semiconductor laser 61 for pumping a solid-state laser crystal, a collimator lens 62 which collimates a laser beam emitted from the laser 61, a condenser lens 63 which condenses the collimated laser beam, a solid-state laser crystal 64 which is provided with a high-reflection coating film 65 and is pumped by the laser beam emitted from the semiconductor laser 61, a $LiNbTaO_3$ wavelength convertor 68 which converts the laser beam (as the fundamental wave) emitted from the solid-state laser crystal 64 to its second harmonic and a mirror 66 which forms a resonator 60 together with the high-reflection coating film 65. The wavelength convertor 68 is a pseudo-phase-matching wavelength convertor having periodic domain reversals.

The laser beam emitted from the semiconductor laser 61 impinges upon the solid-state laser crystal 64 after collimated and condensed by the lenses 62 and 63. The solid-state laser crystal 64 is pumped by the laser beam and produces laser oscillation to emit a laser beam. The laser beam emitted from the solid-state laser crystal 64 impinges upon the wavelength convertor 68 and is converted to its second harmonic. The single mode second harmonic emitted from the wavelength convertor 68 is condensed on the light incident end face of an optical waveguide 7 of the light amplifier 20'. The optical waveguide 7 flares toward its light emanating end face from the light incident end face. When an electric current is injected into the optical waveguide 7, the second harmonic is amplified while it is travelling through the optical waveguide 7 and an amplified Gaussian laser beam emanates from the light emanating end face of the optical waveguide 7. The end faces of the light amplifier 20' are provided with coating layers 8 and 9 which are antireflective to the second harmonic and accordingly the single mode and the transverse mode control are maintained. By controlling the electric current injected into the optical waveguide, intensity of the laser beam emitted from the light amplifier 20' can be modulated.

The temperatures of the light source 10' including the semiconductor laser 61 and the resonator 60 and the light amplifier 20' are separately controlled. With the arrangement described above, a high power and high quality Gaussian laser beam can be generated while maintaining the single transverse mode.

Though a $LiNbTaO_3$ optical waveguide type pseudo-phase-matching wavelength convertor is employed as the wavelength convertor in the embodiments described above, an optical waveguide type wavelength convertor utilizing a domain reversal such as $LiNbO_3$ may also be employed. In the case of an optical waveguide type wavelength convertor, a wavelength selector such as a grating or a filter may be used to stabilize the oscillating wavelength of the semiconductor laser. Further a LiNbTaO3 bulk type pseudo-phase-matching wavelength convertor having periodic domain reversals in the resonator, a bulk type pseudo-phase-matching wavelength convertor utilizing a domain reversal such as $LiNbO_3$ or the like may be employed as the wavelength convertor. Though an n-type substrate is employed in the light amplifiers in the embodiments described above, it is possible to use a p-type substrate.

What is claimed is:

1. An apparatus for producing a short wavelength laser of high amplitude comprising:

a laser light source producing a fundamental wave, said fundamental wave having a long wave length;

a wavelength converter which converts the fundamental wave to a second harmonic of the fundamental wave, said second harmonic having a short wavelength and low amplitude; and a semiconductor laser light amplifier having a gain at a wavelength corresponding to the second harmonic, end faces of the light amplifier being provided with an antireflection coating layer, for amplifying the second harmonic to produce the short wavelength laser of high amplitude wherein the light amplifier is provided with antireflection coating on both light incident end face through which the second harmonic enters the amplifier and light emanating end face from which the short wavelength of high amplitude emanates.

2. The apparatus of claim 1 in which the light amplifier is provided with an optical wave guide extending from the light incident end face to the light emanating end face.

3. The apparatus of claim 2 in which the optical wave guide is substantially uniform in width from the light incident end face to the light emanating end face.

4. The apparatus of claim 2 in which the optical wave guide is flared from the light incident end face toward the light emanating end face.

5. The apparatus of claim 2 in which the optical wave guide is flared toward the light emanating end face at least near the light emanating end face.

6. The apparatus of claim 1 in which the light amplifier has a light modulation function.

* * * * *